United States Patent [19]

Cross et al.

[11] 4,278,492
[45] Jul. 14, 1981

[54] FREQUENCY TRIMMING OF SURFACE ACOUSTIC WAVE DEVICES

[75] Inventors: Peter S. Cross, Palo Alto; William R. Shreve, Sunnyvale, both of Calif.

[73] Assignee: Hewlett-Packard Company, Palo Alto, Calif.

[21] Appl. No.: 113,832

[22] Filed: Jan. 21, 1980

[51] Int. Cl.³ .................. B44C 1/22; C03C 15/00; C03C 25/06; C23F 1/00
[52] U.S. Cl. .................. 156/627; 156/643; 156/646; 156/656; 156/657; 204/192 E; 324/56
[58] Field of Search ............... 156/626, 627, 643, 646, 156/656, 657, 663, 664; 204/164, 192 E, 192 EC, 298; 252/79.1; 324/56; 333/178, 191

[56] References Cited

U.S. PATENT DOCUMENTS

| | | |
|---|---|---|
| 4,092,588 | 5/1978 | Desormiere et al. ............ 156/643 X |
| 4,176,004 | 11/1979 | Johnson et al. .................. 156/662 X |

Primary Examiner—William A. Powell
Attorney, Agent, or Firm—Edward Y. Wong

[57] ABSTRACT

A process is provided for trimming a SAW device while the device is energized and operating at its center frequency. By essentially selectively sputter-etching the substrate or the transducer material only, without requiring a masking operation, the center frequency and other electrical characteristics of the SAW device are trimmed in a precise and controlled manner.

12 Claims, 4 Drawing Figures

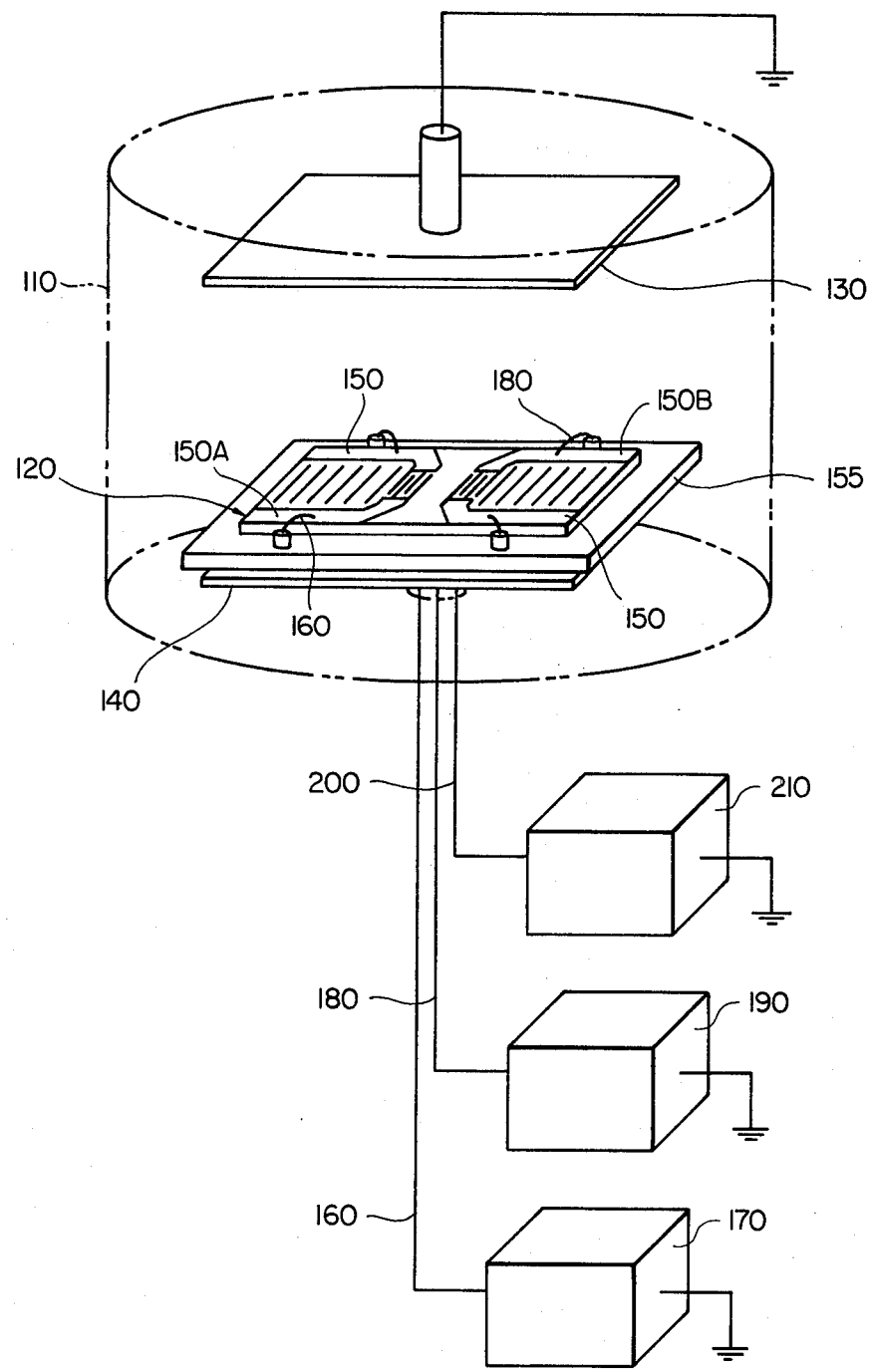
FIG_1

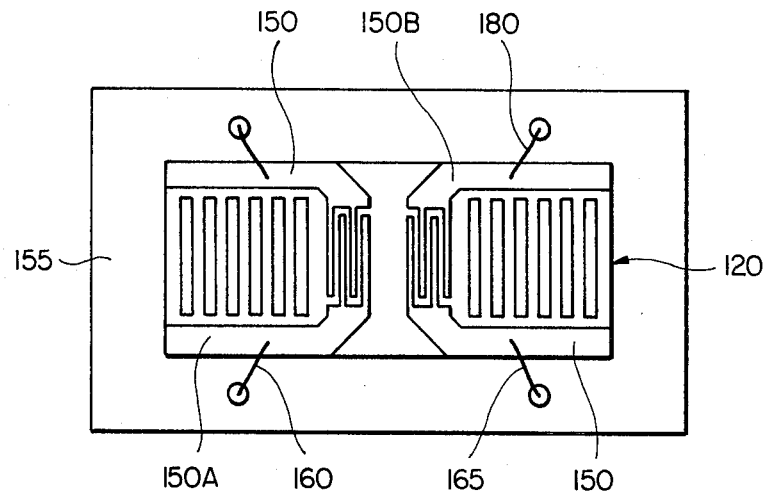
FIG_2
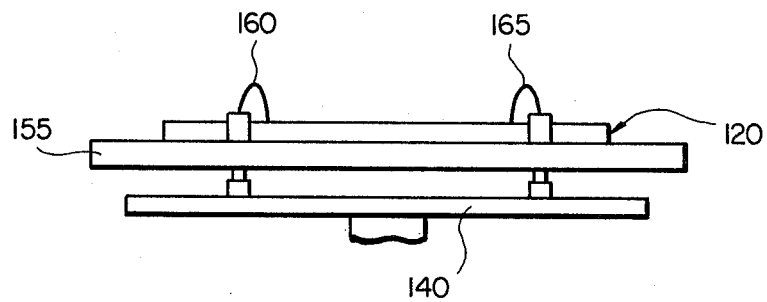
FIG_3
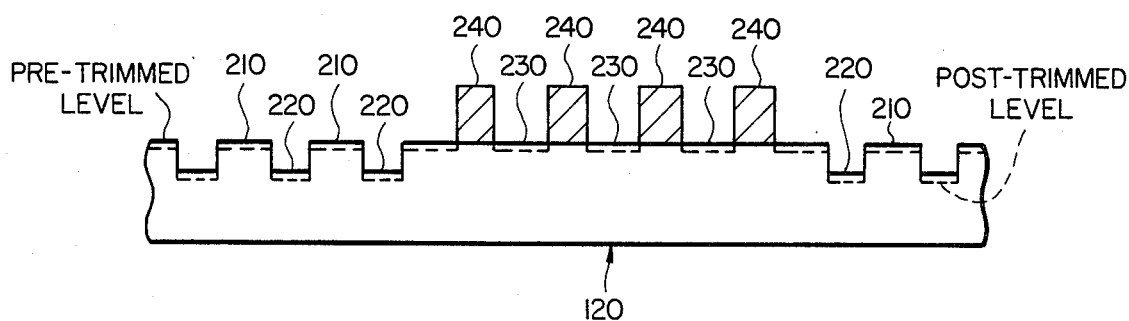
FIG_4

FREQUENCY TRIMMING OF SURFACE ACOUSTIC WAVE DEVICES

BACKGROUND OF THE INVENTION

This invention relates to a method of trimming surface acoustic wave (SAW) devices and, more particularly, to trimming SAW resonant filters by dry etching either the metal electrodes or the substrate between the electrodes.

SAW devices find many applications in communications and other electronic equipment requiring filters having a very narrow frequency response, e.g., bandpass filters or oscillator frequency control elements. These SAW devices typically comprise a substrate on which is deposited one or more precisely formed and positioned interdigital transducers and, often, arrays of precisely positioned etched grooves. See, e.g., U.S. Pat. No. 4,144,507 entitled, "Surface Acoustic Wave Resonator Incorporating Transducer into Reflecting Arrays".

The application of these SAW devices has been accompanied by problems. These problems arise because any variation in groove depth, transducer metal thickness, or linewidth causes a shift in the center frequency and substantially alters the shape of the filter responses. In other words, a prior art surface wave acoustic device may display an improper center frequency and may also be unsuitable due to high insertion loss and/or the presence of a strong spurious mode.

To solve these problems, it is known in the prior art to "trim" the devices after fabrication. Several trimming techniques have been applied, but all have serious drawbacks. As an example, there is the dielectric overlay technique wherein trimming is achieved with a dielectric overlay, such as ZnO. However, using an overlay degrades both the circuit resonance Q and the long-term stability of the device. See, for example, W. R. Shreve, *Proc. 1977 Ultrasonic Symposium,* pp. 857-861.

Another example is the extra transducer technique. In this technique, electrical trimming is achieved by using an extra transducer inside the resonant cavity of the device. This technique, however, provides an insufficient trimming range on weakly coupling materials such as quartz. Furthermore, this technique increases the occurrence of spurious resonant modes in the device. See, for example, P. S. Cross, et al., *Applied Phys. Lett.,* 28, 1-3 Jan. 1, 1976); C. Lardat, *Proc. 1976 Ultrasonic Symposium,* pp. 272-276.

Further, the laser technique is also used for trimming. The laser technique of trimming uses a laser to vaporize away sufficient material to alter the device characteristics. The technique, however, is restrictive. It is suitable only for trimming devices with metal reflectors, which inherently lower the Q of the devices. See, for example, W. R. Shreve, *Proc. 1976 Ultrasonic Symposium,* pp. 706-713.

Also used for trimming is the wet chemical etching technique. According to this technique, the device is trimmed by submerging the device in a bath of hydrochloric acid for wet chemical etching of the metal transducer material. However, this technique is usually insufficiently controllable for consistent results; the uncertainties in etch rates and the unavailability of direct monitoring of the frequency during the trimming process preclude efficient control in the technique.

Still another trimming technique is the groove masking technique. Trimming the SAW device by this technique is achieved by trimming the depth of the reflector grooves in the device, but leaving the substrate material between the electrodes untrimmed. See, for example, W. Tanski, *IEEE Transactions on Sonics and Ultrasonics,* Vol. SU-26, No. 2, March 1979, pp. 93-104. This technique requires that some grating mask for the grooves, e.g., photoresist or metal, remain on the surface of the device during trimming. The subsequent removal of the mask, however, usually leads to an uncertain frequency shift in the device, thus nullifying the initial trimming process to a great extent. See, for example, R. C. M. Li, J. A. Alusow, and R. C. Williamson, *Proc. 1975 Ultrasonic Symposium,* pp. 279-283; C. A. Adams and J. A. Kusters, *Proc. 31st Freq. Control Symposium,* pp. 246-250 (1977).

Hence, there still exists a lack of a suitable method of fabricating SAW devices with a prescribed center frequency, a lack which hitherto has impeded the wider application of these devices.

SUMMARY OF THE INVENTION

In accordance with the present invention, a trimming technique is provided wherein the acoustic velocity and reflectivity of the input-output transducers of a SAW device are varied by dry etching the metal electrodes or, alternatively, the substrate material, including the substrate material between the electrodes without the use of a mask. Furthermore, the device can be operated and monitored electrically during the trimming process.

A SAW device basically consists of one or more interdigital transducers, typically aluminum, deposited on a substrate, typically or quartz. A SAW resonator further consists of two cavity-forming reflective arrays, the "reflectors" of the device. The geometry of the device for a given substrate material establishes the reflector period, while the transducer configuration and the separation between the two reflectors coarsely determine the center frequency.

By subjecting the fabricated SAW device to a controllable dry etching process that selectively etches the substrate material, but not the transducer material, a decrease of several hundred parts per million in the center frequency of the device can be achieved. During such a process, the ridges and troughs in the reflector grooves are substantially uniformly etched without affecting reflector properties. In the transducer region, however, the substrate material between the electrodes is etched, causing an increase in acoustic reflections, a decrease in acoustic velocity, and a concomitant decrease in center frequency. The results of this process is depicted in FIG. 4. Alternatively, the center frequency can be increased by selecting the appropriate etchant such that the transducer metal is etched, but essentially not the substrate material. In this manner, nearly exact trimming of a fabricated SAW device is achieved.

DESCRIPTION OF THE DRAWING

FIG. 1 illustrates an apparatus for trimming SAW devices while being monitored in accordance with a preferred embodiment of the invention.

FIG. 2 shows a top view of the SAW device in FIG. 1 with wires bonded on posts, and FIG. 3 shows a side view of the same device.

FIG. 4 shows a schematic cross-section of a SAW device; it depicts the areas of the SAW device that are trimmed in accordance with the invention.

DESCRIPTION OF THE INVENTION

In FIG. 1 an airtight enclosure 110 contains a SAW device 120 between a first electrode plate 130 and a second electrode plate 140. The SAW device is fabricated with a substrate of piezoelectric material and one or more transducers 150 of electrode material. A first conductor 160 electrically connects an input transducer electrode 150A to an energizing device 170, such as a radio frequency (RF) signal generator, for the acoustic wave device. A second conductor 180 connects an output transducer electrode 150B to a monitoring instrument 190 capable of measuring frequency characteristics like resonant frequency, power, and the like. Monitoring instrument 190 allows for close and continuous monitoring of the device frequency characteristics throughout the trimming process. A third conductor 200 electrically ties second electrode plate 140 to a biasing device 210, such as an RF power supply. In a preferred embodiment, the etching is performed by means of a selective reactive sputter etching process, such as that generally described in U.S. Pat. No. 3,971,684, "Etching Thin Film Circuits and Semiconductor Chips". A chemically reactive etchant gas whose ions react substantially only with either the substrate material or the electrode material of the resonator device is next admitted into the enclosure. For example, an etchant gas in the fluorine group, such as $CF_4$, etches a substrate material like quartz approximately ten times faster than material like aluminum, which is used for transducer electrodes. For trimming purposes, this differential etching rate is essentially equivalent to "selective etching". Similarly, an etchant gas of the chlorine group, such as $CCl_4$ and $CF_3Cl$, etches transducer electrodes such as aluminum at a rate ten times faster than materials like quartz. This differential etching, then, is essentially "selective etching".

Energizing device 170 is activated to operate the acoustic wave device at its center frequency. While the device is operating, biasing device 210 is activated to ionize the etchant gas between the electrode plates within the enclosure. The ions in the vicinity of the acoustic wave device chemically interact with the surface of the device to etch away the surface material. By using the appropriate etchant gas for trimming purposes, essentially either the device substrate material is etched or the electrode material is etched. For example, in etching the substrate material as in FIG. 4, the ridges 210 and troughs 220 and the substrate material 230 between the electrodes 240 are uniformly etched.

During the trimming process, monitoring instrument 190 is constantly displaying the results of the on-going etching; when the appropriate amount of material is etched away and the desired center frequency and other frequency characteristics of the acoustic wave device, e.g filter shape response, are achieved, biasing device 210 is immediately deactivated and etching is terminated. The resultant trimmed acoustic wave device is a precisely tuned resonator with the desired electrical characteristics.

Trimming by the method described offers several substantial advantages over the prior art. These advantages include:

(1) The process is very simple because no masking of any kind is required;

(2) No post-trimming processing is required, so that subsequent undesired frequency shifts are minimized;

(3) The device is functional during trimming so that direct, in situ monitoring can be easily achieved;

(4) By introducing some oxygen with the etchant gas, the etching process serves additionally to remove organic impurities and to partially anodize the aluminum, resulting in improved long-term stability of the device; and (5) Trimming can be made simultaneously on all devices on a wafer (or several wafers), of if desired, on the devices already bonded into packages just prior to sealing.

It should be noted that this method is broadly applicable and can be used with other device configurations, including one-port resonators, multi-cavity resonators, recessed electrode transducers, transversal filters, and correlators.

We claim:

1. A method of trimming an acoustic device fabricated with a substrate of piezoelectric material and a deposit thereon of electrode material, comprising the step of dry etching selectively one of the electrode material and the substrate material between the electrodes to alter the center frequency of said device.

2. A method of trimming an acoustic device as in claim 1 further comprising the steps of:
   exciting said acoustic device to operate at its center frequency; and
   monitoring the frequency characteristics of said device.

3. A method as in claim 1 wherein said acoustic device is comprised of a quartz substrate and a plurality of aluminum electrodes, said method further comprising the steps of:
   admitting into an enclosure containing said acoustic device a chemically reactive etchant gas whose ions etch essentially only one of quartz material and aluminum material;
   applying an exciting means in the enclosure to ionize the reactive etchant gas in the vicinity of said acoustic device thereby causing ions of said gas to react chemically with one of the substrate material and the electrode material; and
   removing the exciting means when the desired center frequency is achieved.

4. A method as in claim 3 further comprising the steps of:
   exciting said acoustic device to operate at its center frequency; and
   monitoring the frequency characteristics of said acoustic device.

5. A method as in claim 3 wherein said etchant gas essentially selectively etches said electrode material to increase the center frequency of said acoustic device.

6. A method as in claim 3 wherein said etchant gas essentially selectively etches said substrate material to decrease the center frequency of said acoustic device.

7. A method as in claim 5 wherein said chemically reactive etchant gas is a chlorine-compound gas.

8. A method as in claim 6 wherein said chemically reactive etchant gas is a fluorine-compound gas.

9. A method as in claim 6 wherein said chemically reactive etchant gas is a gas from the group consisting of $CF_4$, $CHF_3$, and $SF_6$.

10. A method as in claim 5 wherein said chemically reactive etchant gas is a gas from the group consisting of $CCl_4$ and $CF_3Cl_3$.

11. A method as in claim 5 further comprising the steps of:

exciting said acoustic device to operate at its center frequency; and monitoring the frequency characteristics of said acoustic device.

12. A method as in claim 6 further comprising the steps of:

exciting said acoustic device to operate at its center frequency; and monitoring the frequency characteristics of said acoustic device.

* * * * *